United States Patent [19]

Palaniappan

[11] Patent Number: 5,170,059

[45] Date of Patent: Dec. 8, 1992

[54] OPTICALLY COUPLED FAST TURN OFF LOAD SWITCH DRIVE

[75] Inventor: Rasappa Palaniappan, Michigan City, Ind.

[73] Assignee: Sullair Corporation, Michigan City, Ind.

[21] Appl. No.: 606,911

[22] Filed: Oct. 31, 1990

[51] Int. Cl.⁵ ............................................. G02B 27/00
[52] U.S. Cl. ..................................... 250/551; 307/311
[58] Field of Search ........................... 250/551, 214 R; 307/311, 270, 570

[56] References Cited

U.S. PATENT DOCUMENTS

| | | | |
|---|---|---|---|
| 3,486,029 | 12/1969 | Barrett et al. | 250/551 |
| 3,524,986 | 8/1970 | Harnden | 250/551 |
| 3,629,590 | 1/1971 | Case | 307/311 |
| 3,810,034 | 5/1974 | Brunsch | 250/551 |
| 3,842,259 | 10/1974 | Bruning | 307/311 |
| 3,895,241 | 7/1975 | Cooper | 250/551 |
| 4,292,551 | 9/1981 | Kolmann | 250/551 |
| 4,321,487 | 3/1982 | Huykman | 250/551 |
| 4,461,955 | 7/1984 | Bezdek | 250/551 |
| 4,504,974 | 3/1985 | Rademaker | 307/311 |
| 4,547,686 | 10/1985 | Chen | 307/570 |
| 4,590,395 | 5/1986 | O'Connor et al. | 307/570 |
| 4,654,544 | 3/1987 | Wheeler | 307/270 |
| 4,675,547 | 6/1987 | Eichenwald | 307/270 |
| 4,716,304 | 12/1987 | Fiebig et al. | 307/270 |
| 4,725,741 | 2/1988 | Shekhawat et al. | 307/315 |
| 4,801,821 | 1/1989 | Prevost et al. | 250/551 |
| 4,885,486 | 12/1989 | Shekhawat et al. | 307/570 |
| 4,891,532 | 1/1990 | Shekhawat et al. | 307/300 |

FOREIGN PATENT DOCUMENTS 1126017 11/1987 Japan.

*Primary Examiner*—David C. Nelms
*Attorney, Agent, or Firm*—Antonelli, Terry, Stout & Kraus

[57] ABSTRACT

A drive ciruit for a load switch (104) controlling current flow through an electrical load (106) in accordance with the present invention includes a switching signal source (10), a first optical coupler (110), coupled to the switching signal source which turns on to produce an output drive signal in response to a first level of a switching signal (100) from the switching signal source to control turning on of the load switch; and a second optical coupler (114) coupled to the switching signal source which turns on to produce an output drive signal in response to a second level of a switching signal from the switching signal source to control turning off of the load switch.

20 Claims, 2 Drawing Sheets

OPTICALLY COUPLED FAST TURN OFF LOAD SWITCH DRIVE

TECHNICAL FIELD

The present invention relates to drive circuits for load switches which utilize optical couplers to electrically isolate a signal drive source from a load switch drive.

BACKGROUND ART

Optical couplers are well known which are photon-coupled devices in which an electrical signal is converted into light that is projected through an insulating interface and reconverted to an electrical signal. Various forms of optical couplers are well known, such as a light emitting diode and photo diode combination, a light emitting diode and photo-transistor combination, a light emitting diode and photo-Darlington combination, a light emitting diode and LDR combination, a neon light and LDR combination, a lamp and LDR combination and a light emitting and diode photo diode driving a transistor switch combination. Optical couplers have a switching characteristic having a fast turn on and a slower turn off. As a result, optical couplers require less time to turn on than to turn off. Diverse switching applications exist in which the electrical isolation provided by an optical coupler is desirable to prevent undesired electrical coupling between a switching signal source and a load switch whose conductivity is being controlled by the switching signal source. An example of such an application is in the drive circuit for a variable reluctance multiple phase electrical motor. Many switching applications in which an optical coupler may be utilized require both a fast turn on and a fast turn off characteristic to optimize performance. Undesirably, a fast turn off characteristic may not be obtained with a single optical coupler controlling both the turning on and the turning off of a load switch (a switch controlling current flow through an electrical load).

FIG. 1 illustrates an example of a prior art drive circuit for a load switch using an optical coupler. A switching signal source 10 provides switching pulses which control the conductivity of a Darlington amplifier 12 comprised of a first bipolar transistor 14 and a second bipolar transistor 16. The switching pulses produced by the switching signal source 10 vary between a first low level and a second high level. The Darlington amplifier 12 is conductive when the switching signal produced by the switching signal source 10 is at the second level. The Darlington amplifier 12 controls the flow of current through an electrical load 18 which may be diverse in nature such as the windings of a single phase of a variable reluctance motor. The switching signal from the switching signal source 10 is electrically coupled to optical coupler 20 which may be any known optical coupler configuration. As described above, the optical coupler provides electrical isolation between the switching signal source and the Darlington amplifier 12. When the switching signal reaches the high level, the optical coupler turns on to produce a high level output signal The turn on characteristic of the optical coupler is relatively fast when compared to the turn off characteristic which occurs when the switching pulse falls from the second level to the first level. The output of the optical coupler is coupled to a first channel 24 which is comprised of amplifier 26 and switch 28. The switch 28 is conductive when the switching signal is at the second level which causes the Darlington amplifier 12 to turn on with a relatively fast turn on characteristic. The output of the optical coupler 20 is coupled to a second channel 30 comprised of inverting amplifier 32 and bipolar transistor 34. The inverting amplifier 32 produces a high level output signal when the switching signal pulse is at the first low level which causes the Darlington amplifier to turn off. However, as a consequence of the relatively slow turn off characteristic of the optical coupler 20, the optical coupler 20 does not rapidly change state in response to the switching signal source falling from the higher second level to the first level which slows down the turn off characteristic of the Darlington amplifier 12.

DISCLOSURE OF INVENTION

The present invention is a drive circuit and a method of turning on and off a switch which provides electrical isolation through optical coupling between a switching signal source and the switch being turned on and off under the control of a signal produced by the switching signal source which has a rapid turn on and turn off characteristic. With the invention, first and second optical couplers are coupled to the switching signal source with the switching signal controlling the turning on and off of the first optical coupler and an inversion of the switching signal controlling the turning on and off of the second optical coupler. Output drive signals produced by the first and second optical couplers are coupled to a control terminal of a load switch for controlling the conductivity of the load switch. As a consequence of an inversion of the switching signal controlling the turning on of the second optical coupler, a rapid turn off characteristic is produced by the load switch which is faster than the turn off characteristic produced by the prior art using a single optical coupler for controlling both the turning on and turning off of a load switch as described above with respect to FIG. 1.

A drive circuit for a load switch controlling current flow through an electrical load in accordance with the invention includes a switching signal source; a first optical coupler coupled to the switching signal source which turns on to produce an output drive signal on an output in response to a first level of a switching signal from the switching signal source to control turning on of the load switch; a second optical coupler coupled to the switching signal source which turns on to produce an output drive signal on an output in response to a second level of a switching signal from the switching signal source to control turning off of the load switch and logic circuitry coupling the output drive signal from each of the optical couplers to the load switch. An inverter is coupled to the switching signal source and to an input of the second optical coupler for inverting a switching signal from the switching signal source which is applied to the second optical coupler. A load switch drive is coupled to outputs of the optical couplers and to the load switch which produces an output signal of a first level when the first optical coupler turns on and an output signal of a second level when the second optical coupler turns on. The optical couplers comprise a light emitting diode coupled to the switching signal source and a photo diode optically coupled to light emitted from the light emitting diode and electrically coupled to a transistor which turns on in response to the photo diode receiving light from the light emitting diode with conduction of the transistor controlling turning on of the load switch. The optical couplers require less time to turn on than to turn off.

In a drive circuit for a load switch controlling current flow through an electrical load an improvement in accordance with the invention includes a first optical coupler controlling turning on of the load switch with an output signal on an output in response to a first level of a switching signal turning on the first optical coupler; a second optical coupler turning off of the load switch with an output signal on an output in response to a second level of a switching signal turning on the second optical coupler; the optical couplers require less time to turn on than to turn off and logic circuitry couples the output drive signal from each of the optical couplers to the load switch. The switching signal source provides the switching signal having the first and second levels. An inverter is coupled to the switching signal source and to an input of the second optical coupler for inverting a switching signal from the switching signal source which is applied to the second optical coupler. A load switch drive is coupled to outputs of the optical couplers and to the load switch which produces an output signal of a first level when the first optical coupler turns on and an output signal of a second level when the second optical coupler turns on. The optical couplers comprise a light emitting diode coupled to the switching signal source and a photodiode optically coupled to light emitted from the light emitting diode and electrically coupled to a transistor which turns on in response to the photodiode receiving light from the light emitting diode with conduction of the transistor controlling turning on of the load switch.

A method of turning on and off a switch with a switching signal having first and second levels with a switch drive having a first optical coupler having an input coupled to a switching signal source and producing a first output drive signal on an output coupled to a control terminal of the switch and a second optical coupler having an input coupled to the switching signal source and producing a second output drive signal on an output other and coupled to the control terminal of the switch in accordance with the invention includes providing the control signal which is a pulse having a signal level of a time duration; applying the control signal to the first optical coupler to turn on the first optical coupler to produce the first output drive signal applied to the control terminal of the switch through logic circuitry to cause the switch to turn on; applying an inversion of the control signal to the second optical coupler to turn on the second optical coupler to produce the second drive signal applied to the control terminal of the switch through logic circuitry to cause the switch to turn off; and wherein the switch is turned on for the time duration. The invention further includes logic gates respectively coupled to the outputs of the first and second optical couplers. The optical couplers require less time to turn on than to turn off.

BEST MODE FOR CARRYING OUT THE INVENTION

Figure 1:
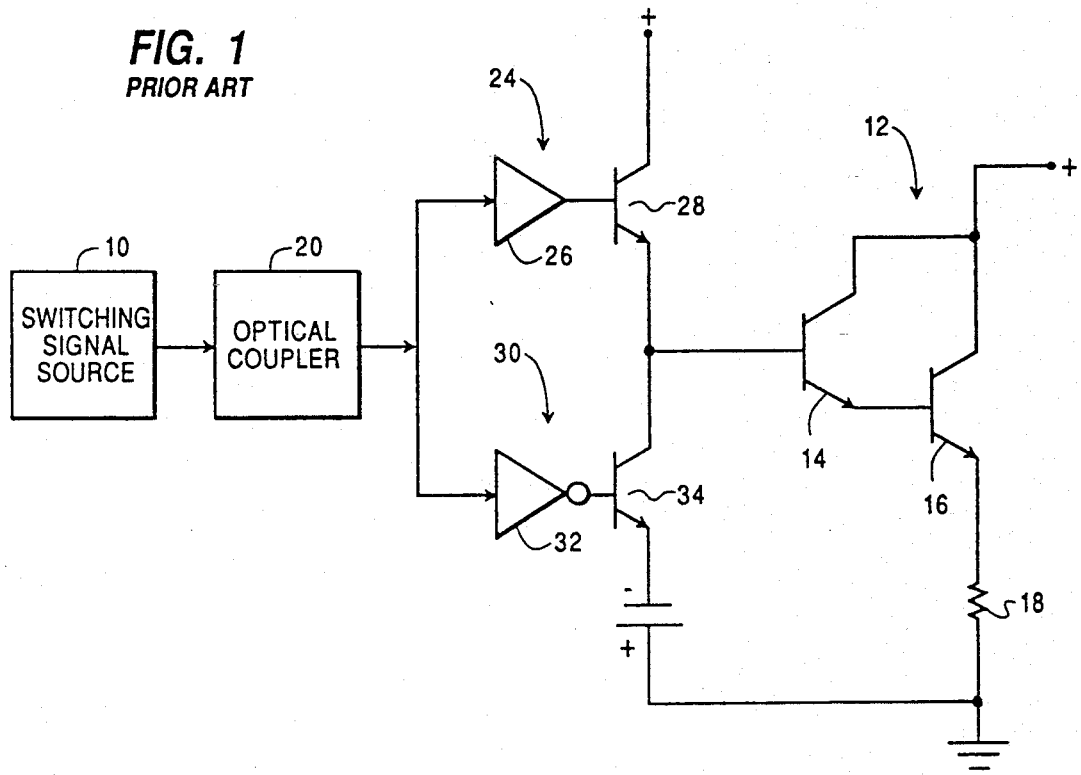
FIG. 1 illustrates a prior art drive circuit including an optical coupler.
Figure 2:
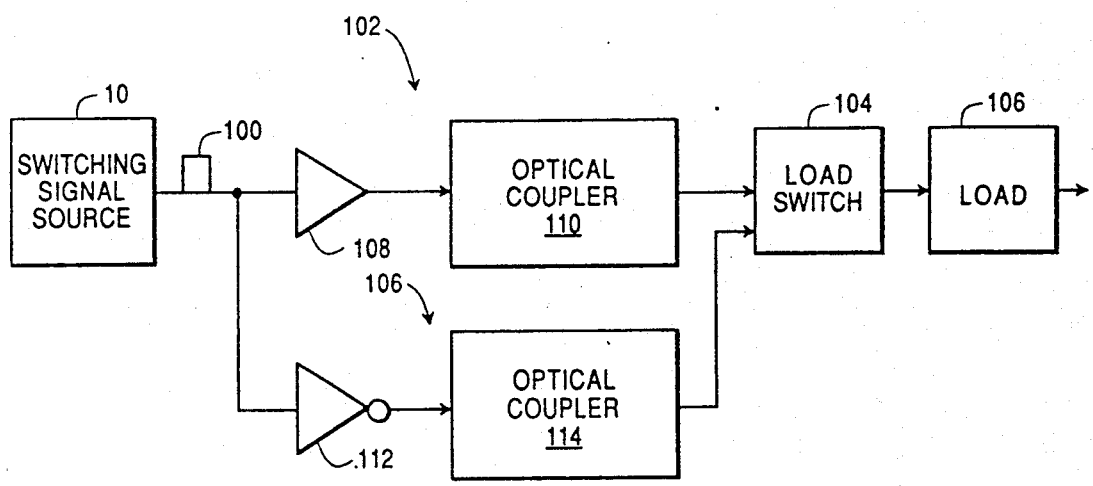
FIG. 2 illustrates a block diagram of the present invention.

FIG. 2 illustrates a block diagram of the present invention. A switching signal source 10 produces an output pulse 100 having a second high level of a time duration. The output pulse 100 is coupled to a first channel 102 which controls the turning on of load switch 104 and a second channel 106 controlling the turning off the load switch 104. The load switch 104 controls the flow of electrical current to an electrical load 106 which may be any electrical load to which switched current is applied such as, but not limited to, the windings of a phase of a variable reluctance motor. The first channel is comprised of a non-inverting amplifier 108 and an optical coupler 110 which may be any known optical coupler having a relatively fast turn on characteristic and a slower turn off characteristic as discussed above. The second channel is comprised of an inverting amplifier 112 and a second optical coupler 114 having the same characteristic as the optical coupler 110. As a consequence of the optical couplers requiring less time to turn on than to turn off, the second channel 106 including the second optical coupler 114 which turns on to cause the load switch to turn off produces a more rapid turn off characteristic than the prior art of FIG. 1 which the relatively slower turn off characteristic of the optical coupler 20 controlled the turning off the Darlington amplifier 12.

The block diagram of FIG. 2 operates as follows. The switching pulse 100 produced by the switching signal source 10 having a first lower level and a higher second level is coupled to both the first and second channels 102 and 106. The pulse 100 is amplified by an amplifier 108 and causes the first optical coupler 110 to turn on to produce a first output drive signal in phase with the switching pulse 100 which is applied to a control terminal (not illustrated) of the load switch to cause the load switch to turn on. The application of the switching pulse 100 to the second channel 106 produces an inversion of the switching pulse 100 which is 180° out of phase with the switching signal produced by the switching signal source 10. As a result, when the switching pulse 100 is falling from the second higher level to the lower first level, the output of the inverter 112 goes high which causes the optical coupler 114 to rapidly turn on to produce the second drive signal applied to the control terminal of the switch to cause the switch to turn off. As a consequence of the inverter driving the optical coupler 114 to turn on when the pulse 100 is falling from the first higher level to the lower second level, the second drive signal has a more rapid rise time producing a faster turn off of the load switch 104 than in the prior art of FIG. 1.

Figure 3:
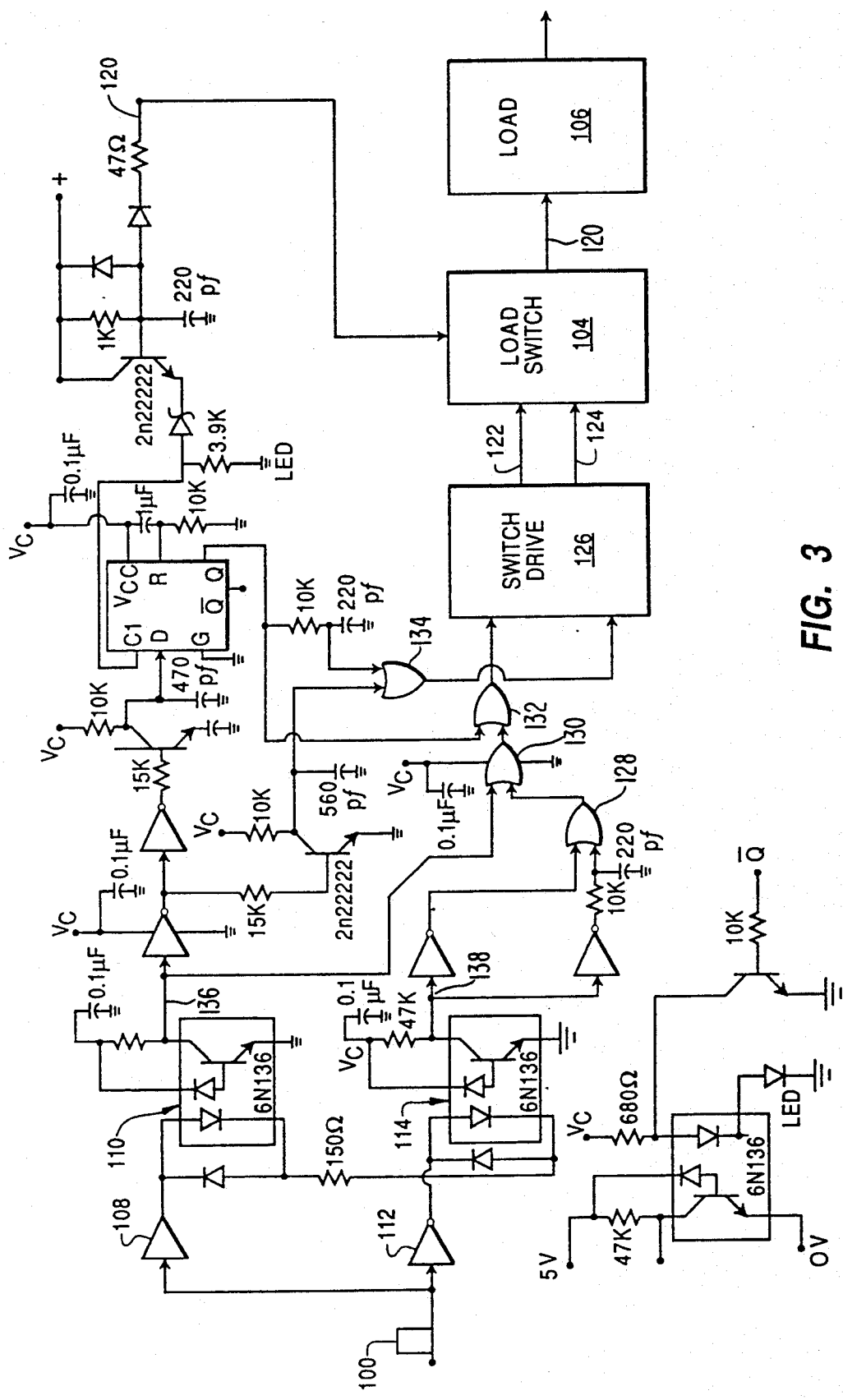
FIG. 3 illustrates a circuit implementation of a drive circuit in accordance with the present invention.

FIG. 3 illustrates a circuit implementation of a drive circuit in accordance with the present invention. Like reference numerals identify like parts in FIGS. 2 and 3. Individual circuit components have been labelled with component values and/or industry or manufacturer's part numbers. Logic gates 128, 130, 132 and 134 isolate the outputs 136 and 138 respectively of the optical couplers 110 and 114. Input 120 may be taken from the collector of a bipolar transistor with outputs 122 and 124 of switch drive 126 being applied to the base and emitter of the bipolar transistor load switch 104. It should be understood that the invention is not limited to the circuit implementation illustrated in FIG. 3.

While the invention has been described in terms of its preferred embodiments, it should be understood that numerous modifications may be made thereto without departing from the spirit and scope of the invention as defined in the appended claims. It is intended that all such modifications fall within the scope of the appended claims.

I claim:

1. A drive circuit for a load switch controlling current flow through an electrical load comprising:
    a switching signal source;
    a first optical coupler coupled to the switching signal source which turns on to produce an output drive signal on an output in response to a first level of a switching signal from the switching signal source to control turning on of the load switch;
    a second optical coupler coupled to the switching signal source which turns on to produce an output drive signal on an output in response to a second level of a switching signal from the switching signal source to control turning off of the load switch; and wherein
    logic circuitry couples the output drive signal from each of the optical couplers to the load switch.

2. A drive circuit in accordance with claim 1 further comprising:
    an inverter, coupled to the switching signal source and to an input of the second optical coupler, for inverting a switching signal from the switching signal source which is applied to the second optical coupler.

3. A drive circuit in accordance with claim 2 further comprising:
    a load switch drive coupled to outputs of the optical couplers and to the load switch which produces an output signal of a first level when the first optical coupler turns on and an output signal of a second level when the second optical coupler turns on.

4. A base drive in accordance with claim 1 wherein:
    the optical couplers comprise a light emitting diode coupled to the switching signal source and a photodiode optically coupled to light emitted from the light emitting diode and electrically coupled to a transistor which turns on in response to the photodiode receiving light from the light emitting diode with conduction of the transistor controlling turning on of the load switch.

5. A base drive in accordance with claim 2 wherein:
    the optical couplers comprise a light emitting diode coupled to the switching signal source and a photodiode optically coupled to light emitted from the light emitting diode and electrically coupled to a transistor which turns on in response to the photodiode receiving light from the light emitting diode with conduction of the transistor controlling turning on of the load switch.

6. A base drive in accordance with claim 3 wherein:
    the optical couplers comprise a light emitting diode coupled to the switching signal source and a photodiode optically coupled to light emitted from the light emitting diode and electrically coupled to a transistor which turns on in response to the photodiode receiving light from the light emitting diode with conduction of the transistor controlling turning on of the load switch.

7. A drive circuit in accordance with claim 1 wherein:
    the optical couplers require less time to turn on than to turn off.

8. A drive circuit in accordance with claim 2 wherein:
    the optical couplers require less time to turn on than to turn off.

9. A drive circuit in accordance with claim 3 wherein:
    the optical couplers require less time to turn on than to turn off.

10. A drive circuit in accordance with claim 4 wherein:
    the optical couplers require less time to turn on than to turn off.

11. A drive circuit in accordance with claim 5 wherein:
    the optical couplers require less time to turn on than to turn off.

12. A drive circuit in accordance with claim 6 wherein:
    the optical couplers require less time to turn on than to turn off.

13. A drive circuit in accordance with claim 1 wherein the logic circuitry comprises:
    logic gates respectively coupled to the outputs of the first and second optical couplers.

14. In a drive circuit for a load switch controlling current flow through an electrical load an improvement comprising:
    a first optical coupler controlling turning on of the load switch with an output signal on an output in response to a first level of a switching signal turning on the first optical coupler;
    a second optical coupler controlling turning off of the load switch with an output signal on an output in response to a second level of a switching signal turning on the second optical coupler;
    the optical couplers require less time to turn on than turn off and logic circuitry couples the output drive signal from each of the optical couplers to the load switch.

15. A drive circuit in accordance with claim 14 further comprising:
    a switching signal source providing the switching signal having the first and second levels.

16. A drive circuit in accordance with claim 15 wherein:
    an inverter, coupled to the switching signal source and to an input of the second optical coupler, for inverting a switching signal from the switching signal source which is applied to the second optical coupler.

17. A drive circuit in accordance with claim 14 further comprising:
    a load switch drive coupled to the outputs of the optical couplers and the load switch which produces an output signal of a first level when the first optical coupler turns on and an output signal of a second level when the second optical coupler turns on.

18. A drive circuit in accordance with claim 16 wherein:
    the optical couplers comprise a light emitting diode coupled to the switching signal source and a photodiode optically coupled to light emitted from the light emitting diode and electrically coupled to a transistor which turns on in response to the photodiode receiving light from the light emitting diode with conduction of the transistor controlling turning on of the load switch.

19. A method of turning on and off a switch with a switching signal having first and second levels with a switch drive having a first optical coupler having an input coupled to a switching signal source and producing a first output drive signal on an output coupled to a control terminal of the switch and a second optical coupler having an input coupled to the switching signal source and producing a second output drive signal on an output coupled to the control terminal of the switch comprising:

providing the control signal which is a pulse having a signal level of a time duration;

applying the control signal to the first optical coupler to turn on the first optical coupler to produce the first output drive signal applied to the control terminal of the switch through logic circuitry to cause the switch to turn on; and applying an inversion of the control signal to the second optical coupler to turn on the second optical coupler to produce the second drive signal applied to the control terminal of the switch through logic circuitry to cause the switch to turn off; and wherein the switch is turned on for the time duration.

20. A method in accordance with claim 19 wherein:
the optical couplers require less time to turn on than to turn off.

* * * * *